US008854244B2

(12) United States Patent
Park et al.

(10) Patent No.: US 8,854,244 B2
(45) Date of Patent: Oct. 7, 2014

(54) IMAGERS WITH IMPROVED ANALOG-TO-DIGITAL CONVERTERS

(71) Applicant: Aptina Imaging Corporation, George Town (KY)

(72) Inventors: Hong-Joo Park, Seoul (KR); Sanghoon Lim, Seoul (KR); Hee-Cheol Choi, Seoul (KR); Hai Yan, San Ramon, CA (US)

(73) Assignee: Aptina Imaging Corporation, George Town (CY)

( * ) Notice: Subject to any disclaimer, the term of this patent is extended or adjusted under 35 U.S.C. 154(b) by 0 days.

(21) Appl. No.: 14/015,749

(22) Filed: Aug. 30, 2013

(65) Prior Publication Data

US 2014/0078360 A1 Mar. 20, 2014

Related U.S. Application Data

(60) Provisional application No. 61/703,202, filed on Sep. 19, 2012.

(51) Int. Cl.
*H03M 1/56* (2006.01)
*H04N 5/355* (2011.01)
*H04N 5/335* (2011.01)

(52) U.S. Cl.
CPC ............ *H04N 5/335* (2013.01); *H04N 5/355* (2013.01); *H03M 1/56* (2013.01)
USPC .......................................... 341/169; 348/297

(58) Field of Classification Search
CPC .......... H03M 1/18; H03M 1/56; H04N 5/235; H04N 5/243; H04N 5/335; H04N 5/35536
USPC ................ 341/139, 168, 169; 348/229.1, 297
See application file for complete search history.

(56) References Cited

U.S. PATENT DOCUMENTS

| 6,362,767 | B1 | 3/2002 | Yang et al. |
| 7,345,613 | B2* | 3/2008 | Higuchi ........................ 341/169 |
| 7,616,243 | B2 | 11/2009 | Kozlowski |
| 7,884,748 | B2 | 2/2011 | Delagnes |
| 7,924,207 | B2 | 4/2011 | Snoeij et al. |
| 8,492,697 | B2 | 7/2013 | Neubauer et al. |
| 2011/0074994 | A1* | 3/2011 | Wakabayashi et al. ....... 348/302 |
| 2013/0207824 | A1 | 8/2013 | Waters et al. |

FOREIGN PATENT DOCUMENTS

WO 2010151806 12/2010

* cited by examiner

*Primary Examiner* — Howard Williams
(74) *Attorney, Agent, or Firm* — Treyz Law Group; Jason Tsai

(57) ABSTRACT

An imager may include analog-to-digital converter circuitry that converts an analog input voltage to a digital output value by generating a number of samples of the analog input voltage. The analog input voltage may be formed from the difference between a pixel signal and a reference signal received at first and second inputs of the analog-to-digital converter circuitry. Processing circuitry may control the number of samples generated from the analog input voltage based on a desired gain level. The analog-to-digital converter circuitry may include a counter that counts to a maximum value. Ramp generation circuitry may generate a ramp signal based on the counter value and apply the ramp signal to the pixel signal at the first input of the analog-to-digital converter circuitry. The total time for generating samples for each different desired gain level may be constant while generating the ramp signal with a slope having a constant magnitude.

20 Claims, 6 Drawing Sheets

IMAGERS WITH IMPROVED ANALOG-TO-DIGITAL CONVERTERS

This application claims the benefit of provisional patent application No. 61/703,202, filed Sep. 19, 2012 which is hereby incorporated by reference herein in its entirety.

BACKGROUND

This relates generally to imaging systems, and more particularly to imaging systems with analog-to-digital converters.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Analog-to-digital converters (ADCs) are used to convert analog signals produced by the pixels into digital signals for processing. Conventional analog-to-digital converters use a comparator to determine when a ramp signal reaches a sampled pixel reset signal. A counter is used to count how many clock cycles are between the initial application of the ramp voltage and the time at which the ramp signal matches the sampled pixel reset signal. The counter value is used as the digital output of the pixel.

Temporal noise can cause inaccuracies in pixel output values. Operation of analog-to-digital converters is a significant contributor of temporal noise and can lead to reduced imaging accuracy. Some analog-to-digital converters reduce temporal noise by collecting multiple digital samples and averaging the results. To collect multiple samples, the ramp signal is applied with a positive slope for a first sample and with a negative slope for a second sample. However, the rate of voltage change per unit time is constant and predetermined by the design of ramp generation circuitry that produces the ramp signal. Producing multiple digital samples using conventional ADC circuitry requires either twice the amount of ADC operational time at a given slope or ramp generation circuitry capable of generating a ramp signal with twice the given slope. Increases in the ADC operational time incurs processing delays and reduced performance. Ramp generation circuitry that produces twice the given slope increases power consumption and, moreover, is not always attainable.

DETAILED DESCRIPTION

Figure 1:
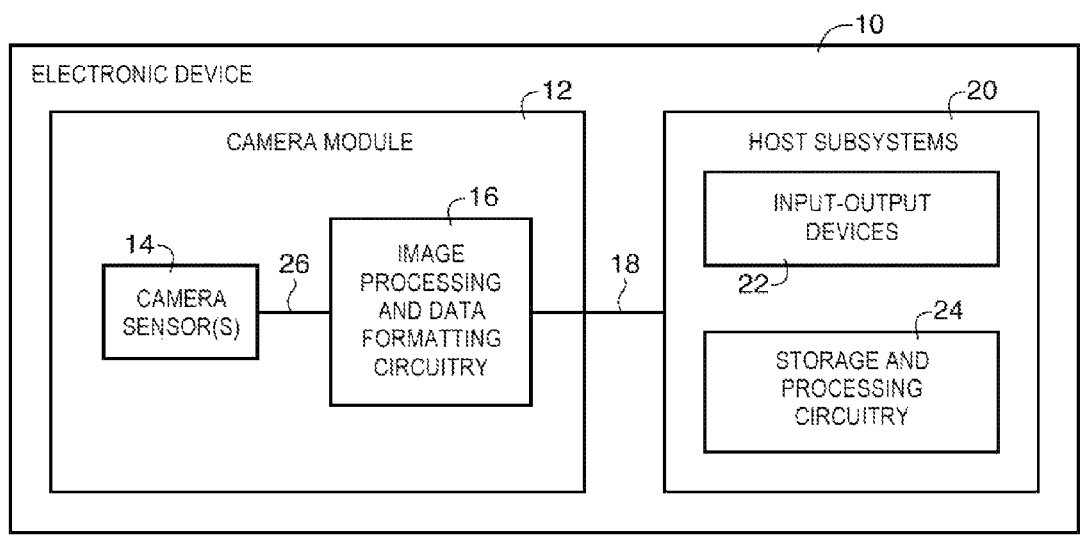
FIG. 1 is an illustrative schematic diagram of an electronic device with a camera sensor that may include improved analog-to-digital converter circuitry in accordance with an embodiment of the present invention.

Embodiments of the present invention relate to image sensors with improved analog-to-digital converter circuitry. An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as three-dimensional depth sensing, data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2A:
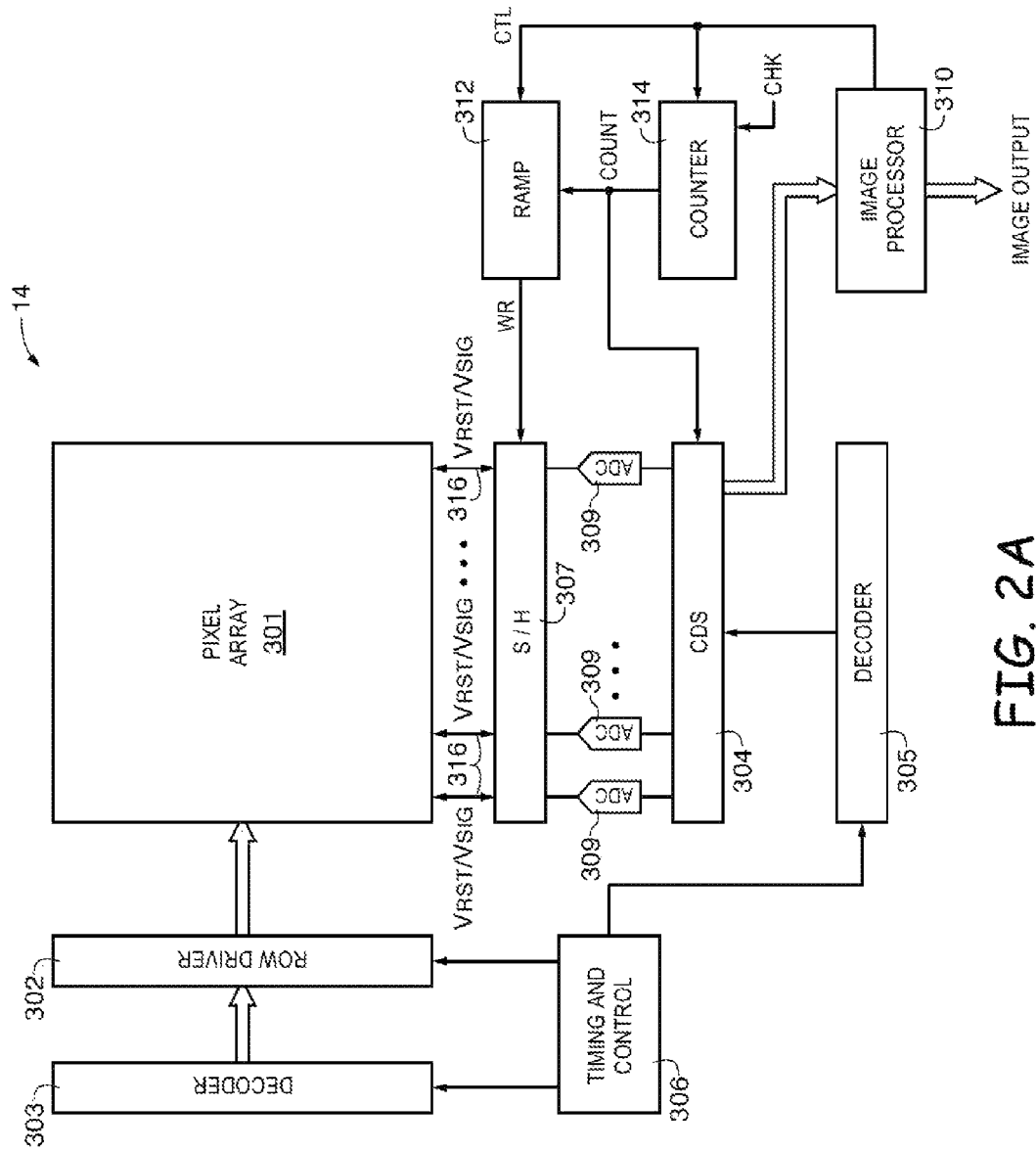
FIG. 2A is a block diagram of an imager having improved analog-to-digital converter circuitry in accordance with an embodiment of the present invention.

FIG. 2A illustrates a simplified block diagram of an imager 14, for example a CMOS imager, employing a pixel array 301 and improved analog-to-digital conversion circuitry. Pixel array 301 includes a plurality of pixels arranged in a predetermined number of columns and rows. The row lines are selectively activated by the row driver 302 in response to row address decoder 303 and the column select lines are selectively activated using column address decoder 305. Thus, a row and column address is provided for each pixel.

Imager 14 is operated by a timing and control circuit 306, which controls decoders 303 and 305 for selecting the appropriate row and column lines for pixel readout, and row and column driver circuitry (e.g., 302), which apply driving voltages to the drive transistors of the selected row and column lines. The pixel signals, which typically include a pixel reset signal Vrst and a pixel image signal Vsig for each pixel (or each photosensitive region of each pixel) are sampled by sample and hold circuitry 307 associated with the column driver 304. Analog-to-digital converters 309 converts the analog pixel signals to digital signals, which are stored in memory at correlated double sampling (CDS) circuitry 304 using a global counter value provided by counter 314. A differential signal (e.g., Vrst−Vsig) is produced for each pixel (or each photosensitive area of each pixel), from the digital samples stored at CDS circuitry 304 and may be fed to an image processor 310 which forms a digital image. Image processor 310 may, for example, be provided as part of image processing and data formatting circuitry 16 of FIG. 1.

Counter 314 may operate using clock signal CLK having a clock period. While enabled, counter 314 may increment or decrement a counter value based on clock signal CLK (e.g., at the rising edge of clock signal CLK). Clock signal CLK may, for example, be generated by clock circuitry at imager 14 and provided to counter 314 over clock paths or may be generated off-chip using external clock circuitry.

Counter 314 may produce output signal COUNT that is provided to correlated double sampling circuitry 304 and ramp generation circuitry 312. Ramp generation circuitry 312 may use counter value COUNT in generating ramp signal Vr. Correlated double sampling circuitry 304 may latch counter value COUNT for each pixel column based on the output of ADC circuitry 309. Ramp counter 314 and ramp generation circuitry 312 may be controlled by one or more control signals CTL. Control signal CTL may configure counter 314 and ramp 312 with configuration settings for various modes of operation. For example, control signal CTL may set the maximum counter value of counter 314 such that counter 314 does not count above the maximum counter value. Control signal CTL may set a maximum counter value by configuring how many bits are used be counter 314 for counter operations. As examples, eight bits may be configured into use for a maximum counter value of 255 (256 possible values from 0-255), nine bits may be configured for a maximum counter value of 511 (512 possible values), and ten bits may be configured into use for a maximum value of 1023 (1024 possible values). Control signal CTL may configure ramp generation circuitry 312 to generate appropriate ramp signals for each mode of operation. In each mode of operation, the slope of the generated ramp signals may have a substantially constant magnitude. The modes of operation may be determined by control or processing circuitry. As an example, image processor 310 may perform auto-exposure operations in determining an appropriate gain level for ADC 309 to apply to pixel signals.

Ambient or image light levels identified during auto-exposure operations may be used in determining the gain level. Reduced or dim light conditions may require higher gain levels to provide digital pixel signals at sufficient levels for image processing. Reduced or minimal gain levels may be sufficient for bright light conditions having increased ambient light intensity. Each gain level may have a corresponding set of control settings for ramp generation circuitry 312 and counter 314.

Figure 2B:
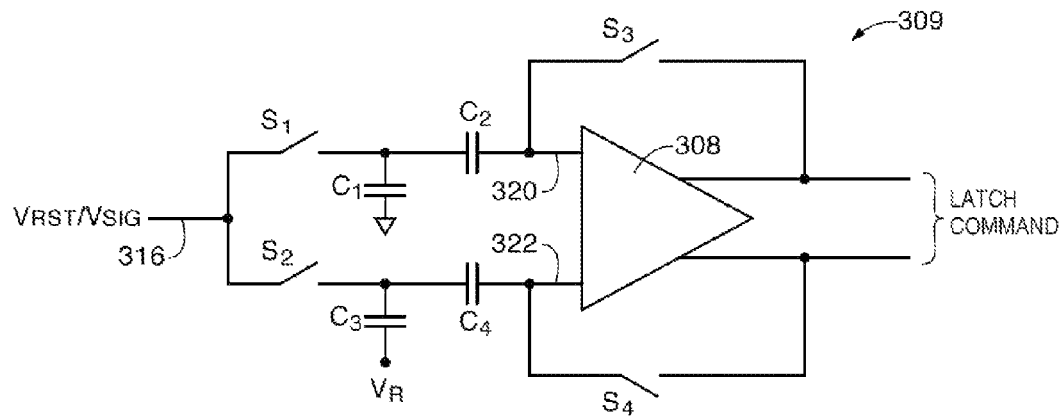
FIG. 2B is a diagram of an illustrative portion of an imager including analog-to-digital converter circuitry in accordance with an embodiment of the present invention.

FIG. 2B is a diagram showing an illustrative portion of imager 14 including sample-and-hold circuitry 307 and ADC circuitry 309 for a given column of pixel array 301 (e.g., the circuitry of FIG. 2B may be replicated for each pixel column). Sample-and-hold circuitry 307, circuitry 309, and correlated-double-sampling circuitry 304 of FIG. 2A may sometimes be collectively referred to herein as analog-to-digital circuitry, because circuitry 307, 309, and 304 are collectively used to perform analog-to-digital conversion operations by sampling pixel signals (e.g., Vrst or Vsig), digitizing the sampled pixel signals (e.g., using ADC 309, counter 314, and CDS 304), and storing the digitized samples (e.g., at CDS 304).

As shown in FIG. 2B, pixel image and reset signals may be sampled onto capacitor C3 by temporarily enabling switch S2. The pixel image signal may be sampled onto capacitor C3 during a pixel image signal conversion period (e.g., a period in which the pixel image signal is digitized and stored at CDS circuitry 304), whereas the pixel reset signal may be sampled onto capacitor C3 during a pixel reset signal conversion period (e.g., a period in which the pixel reset signal is digitized and stored at CDS circuitry 304). ADC circuitry 309 may include amplifier 308. Amplifier 308 may have first and second inputs 320 and 322. Amplifier 308 may receive an analog pixel signal to be digitized at input 322, whereas a reference signal may be received at input 320. The reference signal may, for example, be a sampled pixel reset signal. Amplifier 308 may serve as a comparator that compares the analog signal to the reference signal and produces a comparator output signal. As an example, the comparator output signal may be asserted while the analog pixel signal has a voltage that is less than the reference signal. Auto-zero operations for comparator 308 may be performed by enabling and disabling switches S3 and S4. Ramp signal Vr may be applied by ramp circuitry to the pixel signals at input 322 through capacitors C3 and C4. Ramp signal Vr may increase or decrease at a substantially constant rate (e.g., the absolute value of the slope of ramp signal Vr may be substantially constant during ramp operations). In other words, the magnitude of ramp signal Vr may be constant. The comparator output may be used as a latch command that latches the value of global counter 314 when the combined pixel signals and ramp signal at input 322 reaches the reference signal at input 320.

Figure 2C:
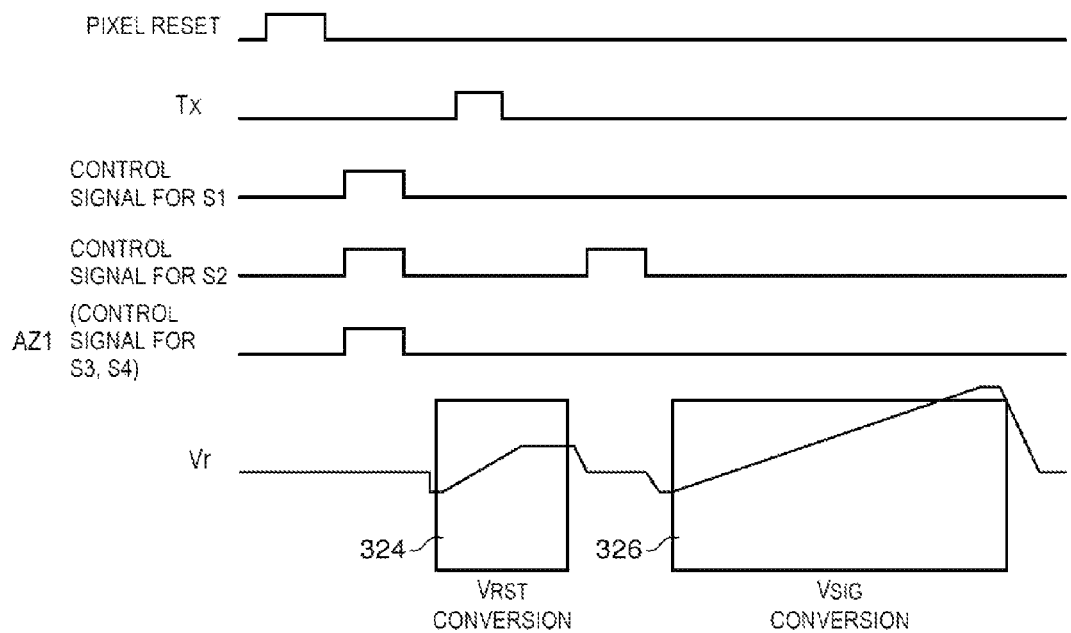
FIG. 2C is a timing diagram illustrating analog-to-digital conversion operations performed on pixel signals in accordance with an embodiment of the present invention.

FIG. 2C is an illustrative timing diagram showing ADC operations and pixel array operations performed using the circuitry of FIGS. 2A and 2B. As shown in FIG. 2C, pixel reset operations may be initially performed by pulsing a pixel reset signal (e.g., a pixel reset signal provided to reset transistors of the pixels in the pixel array). Control signals for switches S1 and S2 may be subsequently pulsed to reset the voltages stored on capacitors C1 and C3 (e.g., to a pixel reset voltage). An auto-zero signal AZ1 may be pulsed to calibrate the operations of comparator 308 by temporarily enabling switches S3 and S4. Subsequently, a pixel reset conversion operation 324 may be performed to digitize the pixel reset voltage by applying ramp signal Vr to input 322 of comparator 308. During this time, a pixel image signal may be transferred to path 316 by asserting a transfer signal at a pixel (e.g., the transfer signal may be pulsed and provided to a transfer gate that transfers charge from a photodiode of the pixel to path 316). Subsequently, the control signal for switch S2 may be pulsed to temporarily enable switch S2 and transfer the pixel image signal to input 322 of comparator 308. A pixel image signal conversion operation may be subsequently performed to digitize the pixel image signal by applying a ramp signal to the pixel image signal at input 322 of comparator 308.

Figure 3:
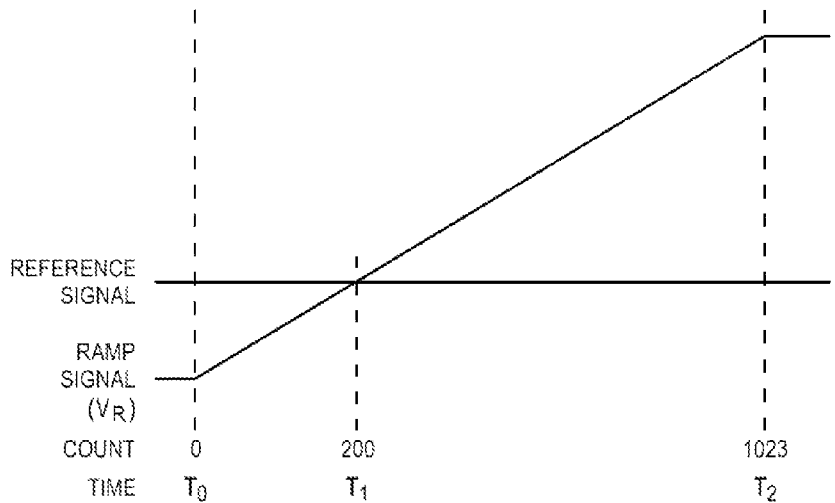
FIG. 3 is a timing diagram showing 1× gain mode operations of analog-to-digital converter circuitry in accordance with an embodiment of the present invention.
Figure 4:
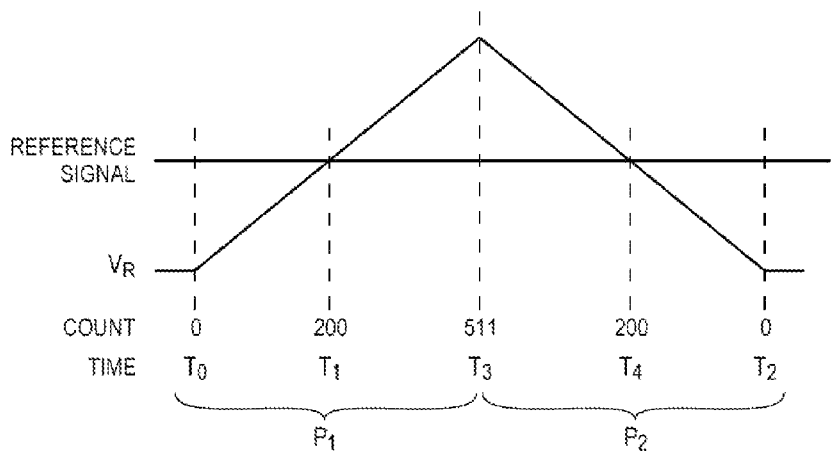
FIG. 4 is a timing diagram showing 2× gain mode operations of analog-to-digital converter circuitry in accordance with an embodiment of the present invention.
Figure 5:
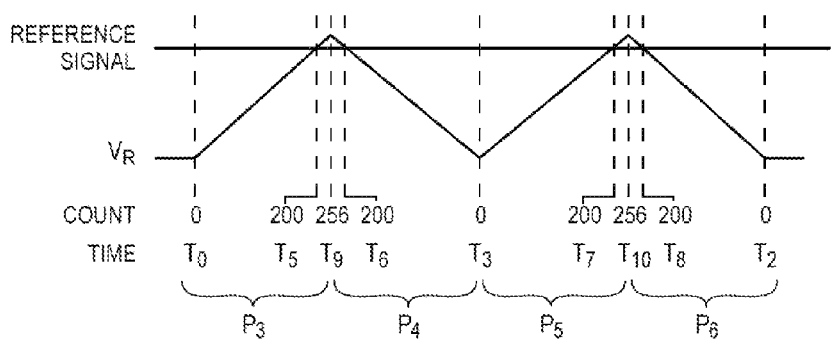
FIG. 5 is a timing diagram showing 4× gain mode operations of analog-to-digital converter circuitry in accordance with an embodiment of the present invention.

FIGS. 3-5 are timing diagrams showing illustrative modes of operation for ADC circuitry 309. Each mode of operation may correspond to a gain level and may therefore be referred to herein as a gain mode that is enabled via control signals such as control signal CTL. The operations performed in FIGS. 3-5 may, for example, be performed during pixel reset conversion operations such as operations 324 of FIG. 2C or may be performed during pixel image conversion operations such as operations 326.

FIG. 3 shows an illustrative 1× gain mode that may be enabled during bright light conditions. In the 1× gain mode, counter 314 may be configured with a maximum counter value of 1023 using control signal CTL, whereas ramp generation circuitry 312 may be configured to produce a ramp signal having constant positive slope (i.e., a constant positive ramp rate). The ramp signal may, for example, be generated from counter 314 (e.g., the ramp signal may be an incrementally stepped function). At or prior to time T0, counter 314 may be reset to zero. A reference signal such as a pixel reset signal may be stored at an input of comparator 308. Sampled analog pixel values (e.g., Vrst or Vsig) may be received from a pixel array via sample-and-hold circuitry. At time T0, ramp signal Vr may be applied to comparator 308. The sampled analog pixel values may be applied to ramp signal Vr so that a difference is formed between the reference signal and the ramp signal. The voltage of signal Vr may increase linearly at the ramp rate. At time T1, the voltage of Vr may reach the voltage of the reference signal (e.g., reset signal Vrst). The counter value at time T1 may have reached 200. In other words, the amount of time between T0 and T1 may be equal to 200 times the clock period of the clock signal used to operate counter 314. Counter output 200 may be latched (e.g., using latch circuitry at ADC 309) as the digital pixel output.

The signal-to-noise ratio of the ADC output may be proportional to the square root of the number of ADC operations used in computing the digital signal output. In the example of FIG. 3, only one sample is taken at time T1. One sample may be sufficiently accurate during bright light conditions in which the initial difference between the reference signal and the ramp signal is sufficiently large. For example, one sample may be sufficiently accurate for bright light conditions in which ADC 309 produces counter values between 512 and 1023. However, at reduced light conditions, it may be desirable to increase the signal to noise ratio.

FIG. 4 shows an illustrative 2× gain mode that may be enabled during somewhat reduced light conditions. As shown in FIG. 4, counter 314 may be configured with a maximum value of 511 in the 2× gain mode while ramp generation circuitry generates a ramp signal during a first period P1 between T0 and T3 having a positive slope and during a second period P2 between T3 and T2 having a negative slope. In other words, the slope of the ramp signal may be inverted for each successive time period. The magnitude of the slope may be substantially the same as the magnitude of the slope in FIG. 3. The counter may be configured to increment the counter value during time periods with positive ramp signal slope and to decrement the counter value during time periods with negative ramp signal slope (e.g., the counter value may be updated for each counter clock cycle). A first counter sample 200 is taken at T1 during the first period, whereas a second counter sample 200 is taken at time T4 during the second period (e.g., each counter sample is taken at an intersection between the reference signal and the ramp voltage produced using the ramp counter value). The first sample may be summed with the second sample to produce a digital pixel output that represents two times the input voltage (e.g., without averaging).

The total time used in performing ADC operations remains the same as in the 1× gain mode scenario, because the counter value 511 that separates the first and second periods is half of the maximum counter value 1023 of the 1× gain mode scenario. In the 2× gain mode, analog pixel output values may be sufficiently low due to reduced light conditions such that intersections between the reference signal and the ramp signal occur before counter 314 reaches maximum counter value 511 (e.g., during the first period) or zero (e.g., during the second period).

If desired, additional samples may be taken without increasing the time required for performing ADC operations. For example, in imaging scenarios such as greatly reduced light conditions, additional time periods in which the ramp circuitry generates ramp signals with sequentially inverted slopes may be used along with reduced maximum counter values. FIG. 5 is an illustrative timing diagram showing ADC operations in a 4× gain mode. As shown in FIG. 5, four samples may be taken when the reference signal and the ramp voltage at times T5, T6, T7, and T8 during respective first (T0 to T9), second (T9 to T3 ), third (T3 to T10), and fourth (T10 to T2) time periods. The first, second, third, and fourth time periods of FIG. 5 are labeled P3, P4, P5, and P6, respectively. The ramp signal may initially have a positive slope in the first time period and the slope may be inverted for each subsequent time period (e.g., negative slope in the second time period, positive slope in the third time period, and negative slope in the fourth time period. The four samples may be summed to produce a digital sample with 4× gain. In the example of FIG. 5, the summed digital samples may be 800.

Figure 6:
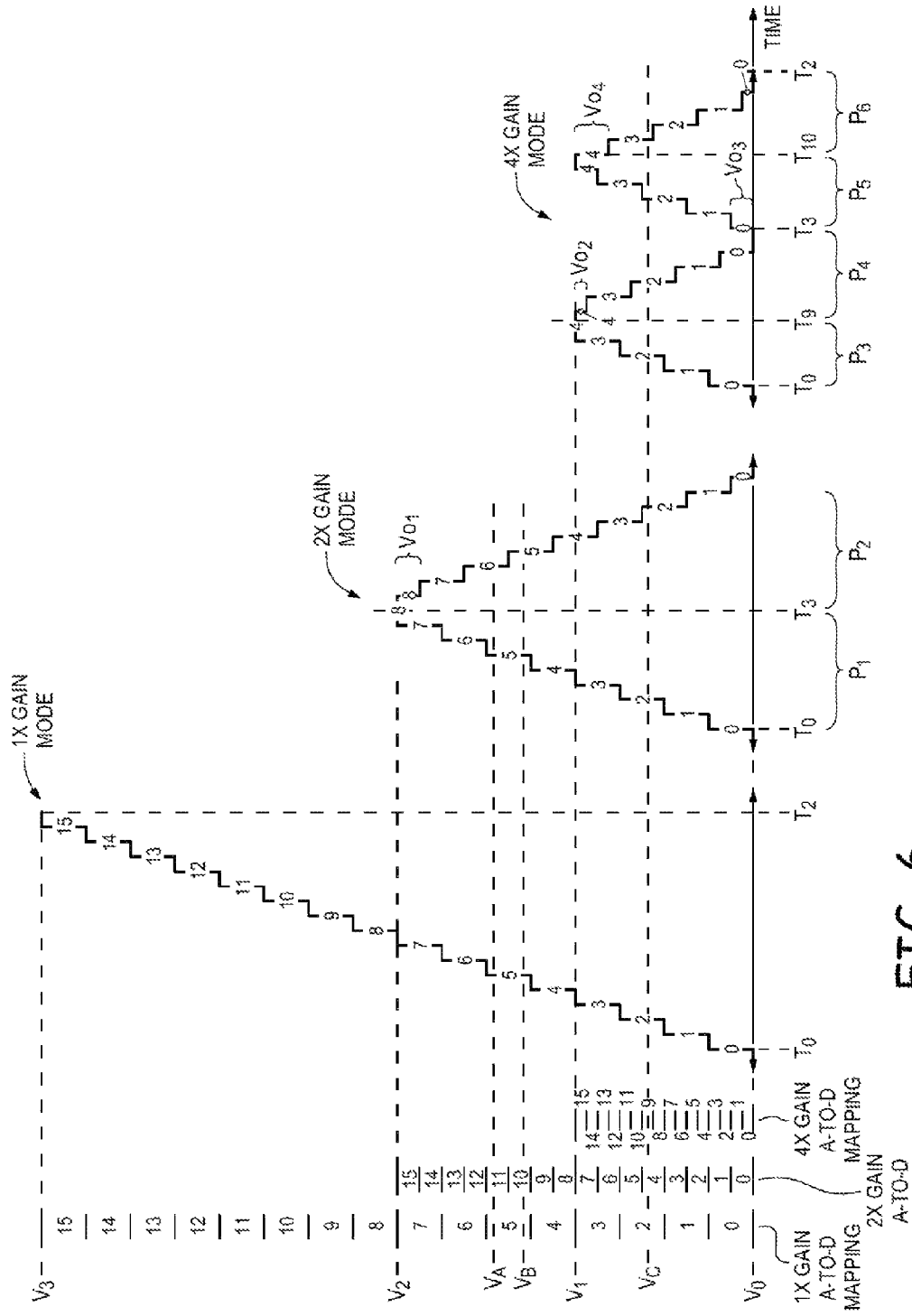
FIG. 6 is a timing diagram showing how ramp signals may be offset in successive time periods of samples obtained during ADC operations to maintain full resolution in accordance with an embodiment of the present invention.

In order to maintain effective resolution while increasing gain levels, it may be desirable to offset analog to digital counter mappings for different time periods. FIG. 6 is a diagram of illustrative digital-to-analog counter mappings for various gain modes. In the example of FIG. 6, the 1× gain mode may have a maximum counter value of 15 (e.g., corresponding to 4-bit counter width), whereas 2× gain mode may have a maximum counter value of 7 and the 4× gain mode may have a maximum counter value of 3.

As shown in FIG. 6, the digital-to-analog mapping of the 1× gain mode maps 16 voltage ranges between V0 and V3 to 16 possible counter values (0-16). In other words, ramp generation circuitry 312 increases the voltage of ramp signal Vr to the next voltage range in response to each unit increase of the ramp counter value. Ramp signal Vr may substantially follow the stepped functions shown in FIG. 6 for each gain mode. The voltage difference between the reference signal and the ramp voltage (e.g., between Vrst and the combination of Vsig and Vr) falls between a predetermined range of the digital-to-analog mapping and is therefore mapped to the corresponding counter value. The digital-to-analog mapping of the 2× gain mode maps 16 voltage ranges between V0 and V2 (which is half the voltage of V3) to digital counter values 0-15. The digital-to-analog mapping of the 4× gain mode maps 16 voltage ranges between V0 and V1 (which is half the voltage of V2) to digital values 0-15.

The resolution of counter operations during 2× and 4× gain modes is constrained by the slope of the corresponding ramp signal and the clock frequency at which the counter operates.

During the 2× gain mode, the digital-to-analog mapping has twice the resolution of the counter operations (i.e., the counter operations have only half the resolution of the digital-to-analog mapping). For example, voltages Va and Vb map to digital values 11 and 10, respectfully. However, the counter value produced during time period P1 is 5 for both Va and Vb. In this scenario, if counter operations during time P2 were the same as during time period P1, the digital sum would be 10 and the ADC may be unable to differentiate between input voltages Va and Vb. As shown in FIG. 6, digital-to-analog counter mapping for time period P2 may be shifted by an offset voltage Vo1 relative to the counter mapping for time period P1. Offset voltage Vo1 may be half of the voltage range covered by each counter value of time period P1. By applying offset voltage Vo1 to ramp signal Vr generated by ramp generation circuitry during time period P2, full resolution of digital-to-analog mapping in the 2× gain mode may be maintained. For example, a first counter value 5 produced during time period P1 may be summed with a second counter value 6 during time period P2 to produce the desired digital output of 11 from input voltage Va.

In the 4× gain mode, the digital-to-analog mapping may have four times the resolution of the counter operations. To provide full resolution, each of time periods P3, P4, P5, and P6 may be assigned a different offset between 0-3 times one-fourth of the voltage range that is mapped to each counter value (e.g., four possible offset configurations). Time period P3 may be assigned an offset of zero, time period P4 may be assigned an offset of Vo2, time period P5 may be assigned an offset of Vo3, and time period P6 may be assigned an offset of Vo4. Voltage offset Vo2 may be one fourth of the voltage range that is mapped to each counter value, voltage offset Vo3 may be half of the voltage range, and voltage offset Vo4 may be three-fourths of the voltage range. The digital samples produced from counter values during time periods P3-P6 may be summed to produce a summed digital sample having full resolution (e.g., from counter values having only quarter resolution).

As an example, the digital-to-analog mapping for 4× gain mode may map voltage Vc to a desired digital output of nine. During time periods P3, P4, P5, and P6, voltage Vc may be assigned counter values of 2, 2, 2, and 3, respectively. These counter values may be summed to produce the desired digital output of 9.

Offset voltages such as Vo1, Vo2, Vo3, and Vo4 may be produced by ramp generation circuitry. For example, the ramp signal may be generated with a desired voltage offset and from the ramp counter value (e.g., the output of counter 314). The ramp generation circuitry may generate the ramp signal according to the digital-to-analog mapping of FIG. 6 for each gain mode. The offset voltage may be configured by processing circuitry using a control signal.

Figure 7:
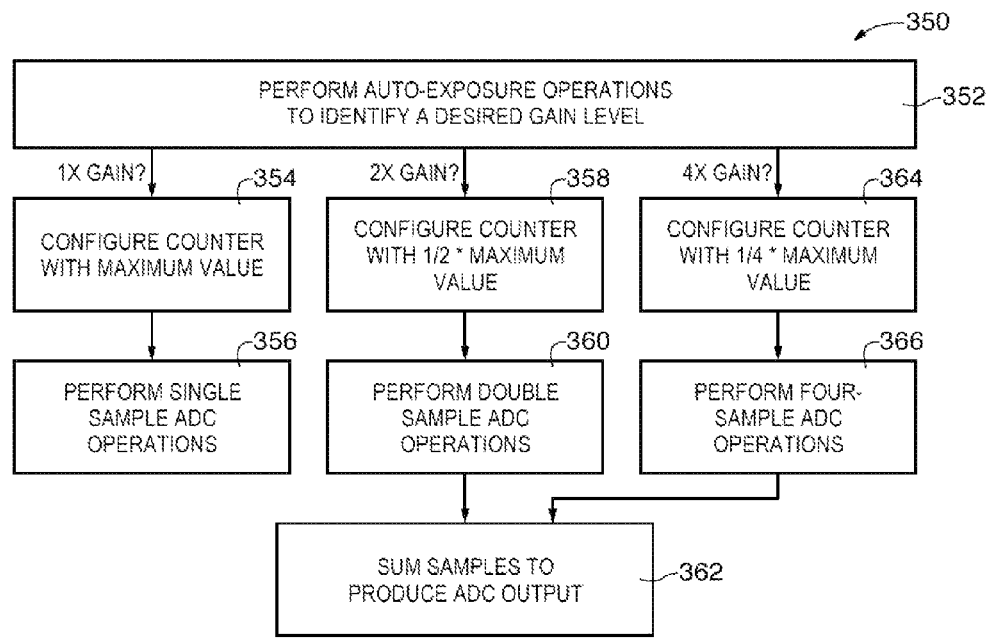
FIG. 7 is a flow chart of illustrative steps that may be performed to operate analog-to-digital converter circuitry in different gain modes while maintaining a constant total time of ADC operations for each gain mode in accordance with an embodiment of the present invention.

FIG. 7 is a flow chart 350 of illustrative steps that may be performed by control and/or processing circuitry to operate ADC circuitry of an image sensor for improved noise characteristics while maintaining ADC processing times substantially constant in producing each digital ADC output sample. The ADC circuitry may include a counter such as counter 314 of FIG. 2 that is used in performing ramp operations. As an example, the operations of flow chart 350 may be performed using on-chip control circuitry, image processor 310 of FIG. 2, or other control circuitry.

During step 352, the circuitry may perform auto-exposure operations to identify a desired gain level. For example, a sample image or a portion of an image may be captured using a pixel array. The captured pixel information may be processed to identify ambient or image light conditions or other image conditions that are used in determining the desired gain level. In response to identifying relatively bright light conditions, a 1× gain mode may be selected for use and the operations of step 354 may be performed. In response to identifying reduced light conditions, a 2× gain mode may be selected for use and the operations of step 358 may be performed. In response to identifying further reduced light conditions, a 4× gain mode may be selected for use and the operations of step 364 may be performed.

During step 354, the circuitry may configure the counter with a maximum counter value. For example, the counter may be configured with a maximum bit-width such as 10 bits for a maximum counter value of 1023. This example is merely illustrative. The counter may be configured with any desired maximum counter value.

During step 356, the circuitry may control the ADC to perform single sample ADC operations. For example, the circuitry may provide control signal CTL to direct ramp circuitry to perform single sample ADC operations such as shown in FIGS. 3 and 6. These operations may be performed for each pixel of the pixel array and each integration time (e.g., for each captured image).

During step 358, the circuitry may configure the counter with half of the maximum counter value. For example, the counter may be configured with a bit-width such as 9 bits for counter values up to 511. During step 360, the circuitry may control the ADC to perform double sample ADC operations such as shown in FIGS. 4 and 6. During step 362, the samples may be summed to produce a digital ADC output.

During step 364, the circuitry may configure the counter with a quarter of the maximum counter value. For example, the counter may be configured with a bit-width of 8 bits for counter values up to 255. During subsequent step 366, the circuitry may control the ADC to perform four-sample ADC operations such as shown in FIGS. 5 and 6.

Figure 8:
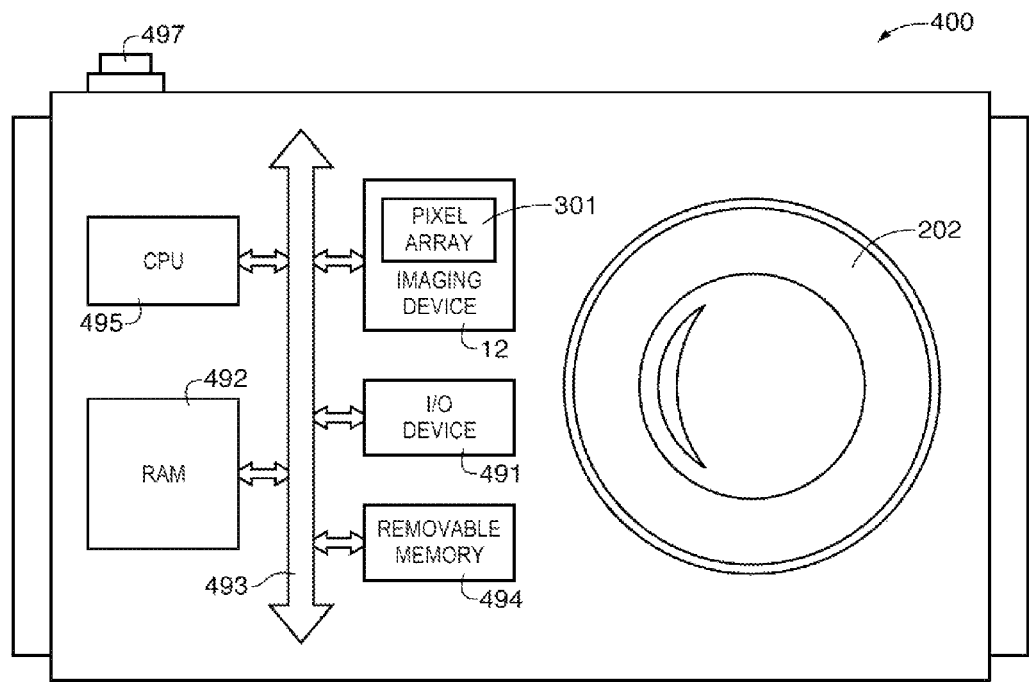
FIG. 8 is a block diagram of a processor system employing the imager of FIG. 2 in accordance with an embodiment of the present invention.

FIG. 8 is a simplified diagram of an illustrative processor system 400, such as a digital camera, which includes an imaging device 12 (e.g., the camera module of FIG. 1) employing an imager having improved ADC circuitry as described above. The processor system 400 is exemplary of a system having digital circuits that could include imaging device 12. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 400, for example a digital still or video camera system, generally includes a lens 202 for focusing an image on pixel array 301 when a shutter release button 497 is pressed, central processing unit (CPU) 495, such as a microprocessor which controls camera and one or more image flow functions, which communicates with one or more input/output (I/O) devices 491 over a bus 493. Imaging device 12 also communicates with CPU 495 over bus 493. System 400 also includes random access memory (RAM) 492 and can optionally include removable memory 494, such as flash memory, which also communicates with CPU 495 over the bus 493. Imaging device 12 may be combined with the CPU, with or without memory storage on a single integrated circuit or on a different chip. Although bus 493 is illustrated as a single bus, it may be one or more busses, bridges or other communication paths used to interconnect system components of system 400.

Various embodiments have been described illustrating imagers with improved ADC operations.

An imager may include analog-to-digital converter circuitry that converts an analog input voltage to a digital output value by generating a number of samples of the analog input voltage. The analog input voltage may be formed from the difference between a reference signal and a pixel signal such as a pixel image output signal or a pixel reset signal. The pixel signal and the reference signal may be received at first and second inputs of a comparator of the analog-to-digital converter circuitry. The pixel signals may be received from an array of pixels. Processing circuitry such as an imaging processor may produce one or more control signals that control the number of samples generated from the analog input voltage based on a desired gain level. The desired gain level may be determined by performing auto-exposure operations using the array of pixels. As an example, the analog-to-digital converter circuitry may generate a first number of samples of the input voltage over a first total time period in response to identifying a first desired gain level and may generate a second number of samples of the input voltage over a second total time period in response to identifying a second desired gain level. The analog-to-digital converter circuitry may include a counter that counts to a maximum value determined by the control signal (or signals). Ramp generation circuitry may be controlled to generate and apply a ramp signal to the pixel output signal at the first input of the analog-to-digital converter circuitry.

Each sample of the analog input voltage may be generated during a corresponding time period. During each time period, the analog-to-digital converter circuitry may generate the sample of the time period from the counter value for which the pixel signal is equal to the reference signal. The control signal from the processing circuitry may configure the ramp generation circuitry to produce the ramp signal with a slope that is inverted for each successive time period and has a constant magnitude and to apply an offset voltage to the ramp signal for each time period. The offset voltage of each time period may be different from other time periods of the samples.

The processing circuitry may use the control signal to configure the analog-to-digital converter circuitry in a first gain mode for a first desired gain level and in a second gain mode for a second desired gain level. In the first gain mode, the analog-to-digital converter circuitry may generate a first number of samples of the input voltage and the time periods corresponding to the first number of samples combine to form a first total time of sampling. The processing circuitry may configure the counter circuitry with a first maximum counter value. In the second gain mode, the analog-to-digital converter circuitry may generate a second number of samples of the input voltage and the time periods corresponding to the second number of samples combine to form a second total time of sampling. The processing circuitry may configure the counter circuitry with a second maximum counter value. The first total time may be equal to the second total time.

The foregoing is merely illustrative of the principles of this invention and various modifications can be made by those skilled in the art without departing from the scope and spirit of the invention.

What is claimed is:

1. An imager, comprising:
   analog-to-digital converter circuitry that converts an analog input voltage to a digital output value by generating a number of samples of the analog input voltage; and
   processing circuitry that produces a control signal that controls the number of samples generated from the analog input voltage based on a desired gain level for the analog-to-digital converter circuitry.

2. The imager defined in claim 1 wherein the analog-to-digital converter circuitry comprises a counter that counts to a maximum value that is determined by the control signal.

3. The imager defined in claim 2 further comprising an array of pixels.

4. The imager defined in claim 3 wherein the analog-to-digital converter circuitry comprises a comparator having first and second inputs, wherein the first input receives a pixel signal from the array of pixels, wherein the second input receives a reference signal, wherein the comparator produces a comparator output signal from the pixel signal and the reference signal, and wherein the analog input voltage is formed from a difference between the pixel signal and the reference signal.

5. The imager defined in claim 4 wherein the counter produces a counter value and wherein the counter is configured with a maximum counter value based on the control signal.

6. The imager defined in claim 5 wherein the analog-to-digital converter circuitry comprises ramp generation circuitry that generates and applies a ramp signal to the pixel signal at the first input based on the control signal and the counter value.

7. The imager defined in claim 6 wherein the analog-to-digital converter circuitry generates each sample of the analog input voltage during a corresponding time period and wherein, during each time period, the analog-to-digital converter circuitry generates the sample of that time period from the counter value for which the pixel signal is equal to the reference signal.

8. The imager defined in claim 7 wherein the control signal configures the ramp generation circuitry to produce the ramp signal with a slope that is inverted for each successive time period, wherein the control signal configures the ramp generation circuitry to apply an offset voltage to the ramp signal for each time period, and wherein the offset voltage applied to each time period is different from other time periods.

9. The imager defined in claim 8 wherein the control signal configures the analog-to-digital converter circuitry in a first gain mode for a first desired gain level and in a second gain mode for a second desired gain level, wherein the analog-to-digital converter circuitry generates a first number of samples of the input voltage in the first gain mode, wherein the analog-to-digital converter circuitry generates a second number of samples of the input voltage in the second gain mode, wherein the time periods corresponding to the first number of samples combine to form a first total time, wherein the time periods corresponding to the second number of samples combine to form a second total time, and wherein the first total time is equal to the second total time.

10. The imager defined in claim 9 wherein the control signal configures the counter circuitry with a first maximum counter value in the first gain mode and wherein the control signal configures the counter circuitry with a second maximum counter value in the second gain mode.

11. The imager defined in claim 9 wherein the first desired gain level of the first gain mode is less than the second desired gain level of the second gain mode, wherein the first maximum counter value is less than the second maximum counter value, wherein the time period of each sample in the first gain mode is shorter than the time period of each sample in the second gain mode.

12. The imager defined in claim 3 wherein the circuitry comprises an image processor that determines the desired gain level by performing auto-exposure operations using the array of pixels.

13. A method of operating an imager having analog-to-digital converter circuitry that converts an input voltage to a digital output signal, the method comprising:
with processing circuitry, identifying a desired gain level;
with the analog-to-digital converter circuitry, generating a first number of samples of the input voltage over a first total time period in response to identifying a first desired gain level; and
with the analog-to-digital converter circuitry, generating a second number of samples of the input voltage over a second total time period in response to identifying a second desired gain level, wherein the first total time period is equal in length to the second total time period.

14. The method defined in claim 13 wherein the analog-to-digital converter circuitry comprises comparator circuitry and ramp generation circuitry, the method further comprising:
with the comparator circuitry, receiving first and second input signals and producing a comparator output signal, wherein a difference between the first and second input signals forms the input voltage; and
with the ramp generation circuitry, applying a ramp signal to the first input signal.

15. The method defined in claim 14 wherein the analog-to-digital convert circuitry further comprises a counter, the method further comprising:
with the counter, producing a counter value, wherein the ramp generation circuitry generates the ramp signal based on the counter value and wherein the analog-to-digital converter circuitry produces each sample of the first and second number of samples from the counter value.

16. The method defined in claim 15 further comprising:
with the processing circuitry, configuring the counter with a maximum counter value based on the desired gain level identified by the processing circuitry.

17. The method defined in claim 16 further comprising:
with the processing circuitry, configuring the ramp generation circuitry to generate the ramp signal with a slope having a constant magnitude.

18. The method defined in claim 17 wherein generating the first number of samples of the input voltage over the first total time period comprises:
generating each sample of the first number of samples during a respective portion of the first total time period;
with the ramp generation circuitry, inverting the slope of the ramp signal for each successive portion of the first total time period; and
with the ramp generation circuitry, applying an offset voltage to the ramp signal for each successive portion of the first total time period, wherein the offset voltage of each portion of the first total time period is different from other portions of the first total time period.

19. A system, comprising:
a central processing unit;
memory;
input-output circuitry; and
an imaging device, wherein the imaging device comprises:
a pixel array;
a lens that focuses an image on the pixel array; and
analog-to-digital converter circuitry having a first configuration in which a first number of samples of an input voltage are generated over a first total time period and having a second configuration in which a second number of samples of an input voltage are generated over a second total time period, wherein the first total time period is equal in length to the second total time period.

20. The system defined in claim 19 wherein the analog-to-digital converter circuitry comprises:
a comparator that receives a pixel signal and a reference signal that form the input voltage and produces a comparator output signal;
a counter that produces a counter value; and
a ramp generation circuit that generates a ramp signal based on the counter value and applies the ramp signal to the pixel signal.

* * * * *